(12) United States Patent
Wang

(10) Patent No.: US 11,658,112 B2
(45) Date of Patent: May 23, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 111 days.

(21) Appl. No.: 17/221,071

(22) Filed: Apr. 2, 2021

(65) Prior Publication Data
US 2021/0335704 A1    Oct. 28, 2021

(30) Foreign Application Priority Data
Apr. 23, 2020    (CN) .......................... 202010328306.5

(51) Int. Cl.
  *H01L 23/522*    (2006.01)
  *H01L 29/417*    (2006.01)
  *H01L 21/768*    (2006.01)
  *H01L 29/45*    (2006.01)
  *H01L 23/532*    (2006.01)
  *H01L 29/78*    (2006.01)

(52) U.S. Cl.
  CPC .... *H01L 23/5226* (2013.01); *H01L 21/76807* (2013.01); *H01L 29/41791* (2013.01); *H01L 21/76877* (2013.01); *H01L 23/53257* (2013.01); *H01L 29/45* (2013.01); *H01L 29/785* (2013.01); *H01L 2221/1036* (2013.01)

(58) Field of Classification Search
  CPC ...................... H01L 23/5226; H01L 21/76877
  See application file for complete search history.

(56) References Cited

U.S. PATENT DOCUMENTS

| 10,388,745 | B1* | 8/2019 | Sung | ................ | H01L 21/76805 |
| 2019/0035734 | A1* | 1/2019 | Ho | .................... | H01L 21/76804 |
| 2020/0135871 | A1* | 4/2020 | Tsai | ................ | H01L 21/76856 |

* cited by examiner

*Primary Examiner* — Farun Lu
(74) *Attorney, Agent, or Firm* — Anova Law Group, PLLC

(57) ABSTRACT

A semiconductor structure and a fabrication method are provided. The semiconductor structure includes: a substrate; a gate structure on the substrate and extending along a first direction; source/drain doped layers in the substrate at sides of the gate structure; a first conductive structure on the source/drain doped layers; an opening at a top of the gate structure and the first conductive structure; and a second conductive structure in the opening. The opening extends along a second direction and the second direction is different from the first direction. The second conductive structure is insulated from the first conductive structure and in contact with the gate structure.

19 Claims, 10 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202010328306.5, filed on Apr. 23, 2020, the content of which is incorporated herein by reference in its entirety.

TECHNICAL FIELD

The present disclosure generally relates to the field of semiconductor technology and, more particularly, relates to a semiconductor structure and its fabrication method.

BACKGROUND

As semiconductor technologies develop rapidly, semiconductor devices are developed toward a direction with a higher device density and a higher integration level. For example, flash memories are widely used as storage devices in electronic devices including digital cameras, notebook computers, or tablet computers. Therefore, reducing a size of a flash memory unit and thereby reducing cost of a flash memory are directions of technological development. For a NOR gate electrical erasing tunnel oxide flash memory, a self-align contact process can be used to fabricate conductive structures on surfaces of a source and a drain, meeting requirements of fabricating a flash memory with a smaller size.

However, even the self-align contact process is used to fabricate the conductive structures on the surfaces of the source or the drain, the performance of the formed semiconductor structure still needs to be improved.

SUMMARY

One aspect of the present disclosure provides a semiconductor structure. The semiconductor structure includes: a substrate; a gate structure on the substrate and extending along a first direction; source/drain doped layers in the substrate at sides of the gate structure; a first conductive structure on the source/drain doped layers; an opening at a top of the gate structure and the first conductive structure; and a second conductive structure in the opening. The opening extends along a second direction and the second direction is different from the first direction. The second conductive structure is insulated from the first conductive structure and in contact with the gate structure.

Optionally, the opening passes across the first conductive structure at the sides of the gate structure along the second direction.

Optionally, the opening does not pass across the first conductive structure at the sides of the gate structure along the second direction.

Optionally, the semiconductor structure further includes multiple gate structures, and the first conductive structure is disposed between adjacent gate structures and extends along the first direction.

Optionally, each gate structure includes a gate dielectric layer, a gate electrode layer on the gate dielectric layer, a protective layer on the gate electrode layer, and sidewall spacers at sides of the gate electrode layer and the protective layer. The second conductive structure is disposed at a portion of a top surface of the protective layer, and in contact with the sidewall spacers.

Optionally, a depth-to-width ratio of the first conductive structure is about 1:1 to about 2:1.

Optionally, a depth-to-width ratio of the second conductive structure is about 0.5:1 to about 2:1.

Optionally, the substrate includes a base substrate and a plurality of fins discrete on the base substrate. The plurality of fins extends along the second direction. The gate structure crosses the plurality of fins and covers a portion of sidewalls and top surfaces of the plurality of fins. The source/drain doped layers are disposed in a corresponding fin of the plurality of fins at the sides of the gate structure.

Optionally, the semiconductor structure further includes an isolation structure on the substrate. The isolation structure covers a portion of the sidewalls of the plurality of fins.

Optionally, the semiconductor structure further includes a first dielectric layer and a second dielectric layer on the first dielectric layer. The first dielectric layer covers the gate structure and the source/drain doped layers, and exposes the top surfaces of the gate structure. The opening is further disposed in the first dielectric layer and the second dielectric layer. The second dielectric layer exposes top surfaces of the first conductive structure and the second conductive structure.

Optionally, the first conductive structure is made of a metal including tungsten.

Optionally, the second conductive structure is made of a metal including tungsten.

Optionally, the semiconductor structure further includes an insulating layer in the opening. The insulating layer is disposed between the first conductive structure and the second conductive structure.

Another aspect of the present disclosure provides a fabrication method for forming a semiconductor structure. The method includes: providing a substrate; forming a gate structure on the substrate and extending along a first direction; forming source/drain doped layers in the substrate at sides of the gate structure; forming a first conductive structure on the source/drain doped layers; forming an opening at a tops of the gate structure and the first conductive structure; and forming a second conductive structure in the opening. The opening extends along a second direction which is different from the first direction. The second conductive structure is insulated from the first conductive structure and in contact with the gate structures.

Optionally, the opening passes across the first conductive structure at the sides of the gate structure along the second direction.

Optionally, the opening does not pass across the first conductive structure at the sides of the gate structure along the second direction.

Optionally, the semiconductor structure further includes multiple gate structures, and the first conductive structure is disposed between adjacent gate structures and extends along the first direction.

Optionally, each gate structure includes a gate dielectric layer, a gate electrode layer on the gate dielectric layer, a protective layer on the gate electrode layer, and sidewall spacers at sides of the gate electrode layer and the protective layer. The first conductive structure is disposed at a portion of a top surface of the protective layer, and in contact with the sidewall spacers.

Optionally, the method further includes forming an insulating layer. The insulating layer and the second conductive structure are formed by: forming an initial insulating layer in the opening; forming a patterned layer on the initial insulating layer to expose a portion of a top surface of the initial insulating layer; etching the initial insulating layer by using the patterned layer as a mask, to form the insulating layer and an insulating opening in the insulating layer, wherein the insulating opening exposes the gate structures; and forming the second conductive structure in the insulating opening Optionally, the substrate includes a base substrate and a plurality of fins discrete on the base substrate. The plurality of fins extends along the second direction. The gate structure crosses the plurality of fins and covers a portion of sidewalls and top surfaces of the plurality of fins. The source/drain doped layers are disposed in a corresponding fin of the plurality of fins at the sides of the gate structure.

Other aspects or embodiments of the present disclosure can be understood by those skilled in the art in light of the description, the claims, and the drawings of the present disclosure.

In the present disclosure, the second conductive structure may be disposed in the opening and in contact with the gate structure. Since the opening may be disposed in the first conductive structure and on the gate structure, the distance between the first conductive structure and the second conductive structure may be reduced effectively, to improve the device integration level of the formed semiconductor structure.

Further, the insulating layer may be disposed in the opening. The insulating layer may be disposed between the first conductive structure and the second conductive structure. Electrical insulation of the insulating layer may be used to prevent short connection between the first conductive structure and the second conductive structure, to improve the electric performance of the formed semiconductor structure.

Further, the opening may penetrate through the first conductive structure at sides along the second direction. By making the opening penetrate through the first conductive structure, the volume of the opening may be increased effectively. In the subsequent processes, the volume of the second conductive structure formed in the opening may be increased too. The contact resistance between the second conductive structure and other devices or structures may be reduced, to improve the electric performance of the formed semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
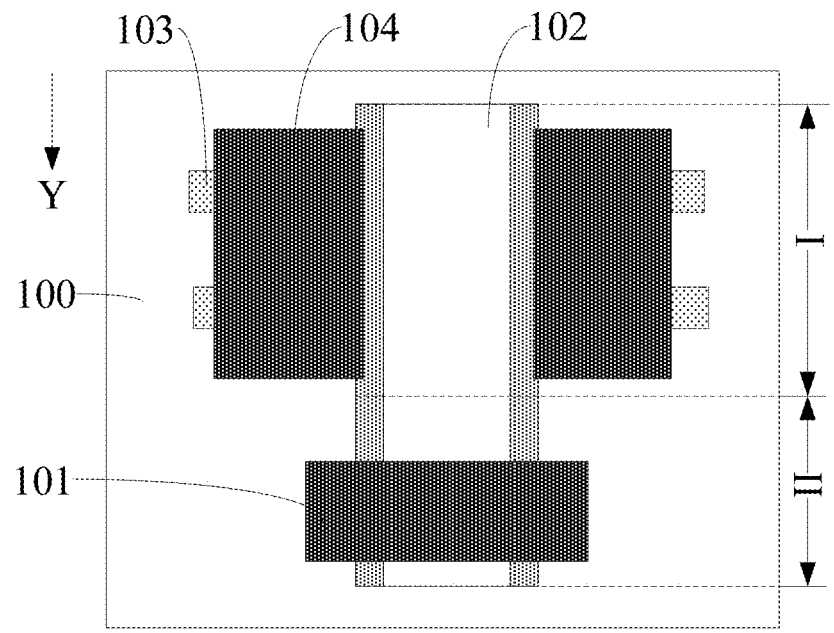
FIG. 1 illustrates a semiconductor structure.

FIG. 1 illustrates a semiconductor structure. As illustrated in FIG. 1, a substrate 100 is provided. A gate structure 102 is formed on the substrate 100. The gate structure 102 extends along a first direction Y, and includes a first region I and a second region II extending along the first direction Y. Source/drain doped layers 103 are formed in the substrate 100 at two sides of a portion of the gate structure 102 in the first region I. First conductive structures 104 are formed on the source/drain doped layers 103. A second conductive structure 101 is formed on another portion of the gate structure 102 in the second region II.

To prevent a short connection between the first conductive structures 104 and the second conductive structure 101, the second conductive structure 101 may be formed on the portion of the gate structure 102 in the second region II. Correspondingly, a distance between the first conductive structures 104 and the second conductive structure 101 may be large, and a space occupied by the first conductive structures 104 and the second conductive structure 101 may be large. An integration level of the formed semiconductor structure may be reduced.

Figure 2:
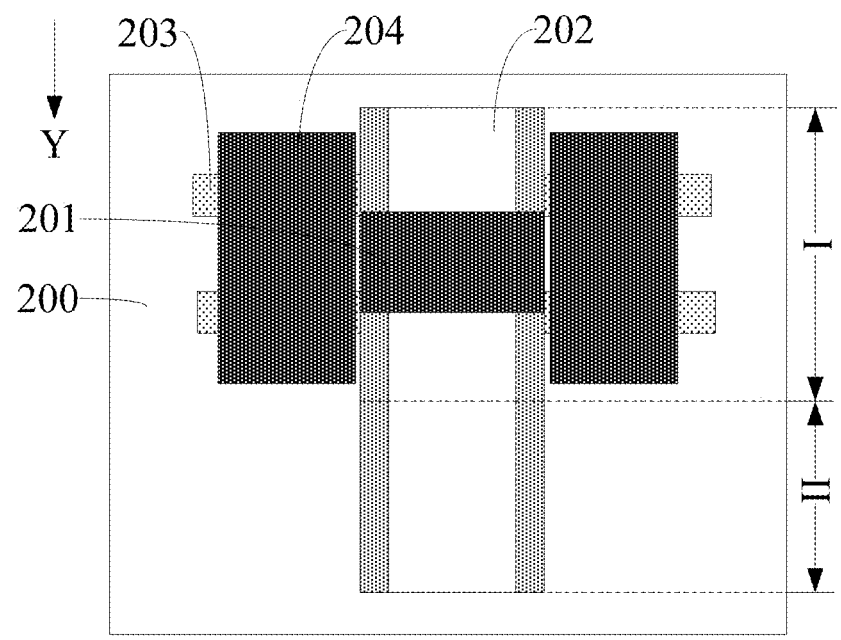
FIG. 2 illustrates another semiconductor structure.

FIG. 2 illustrates another semiconductor structure. As illustrated in FIG. 2, a substrate 200 is provided. A gate structure 202 is formed on the substrate 200. The gate structure 202 extends along a first direction Y, and includes a first region I and a second region II extending along the first direction Y. Source/drain doped layers 203 are formed in the substrate 200 at two sides of a portion of the gate structure 202 in the first region I. First conductive structures 204 are formed on the source/drain doped layers 203. A second conductive structure 201 is formed on the portion of the gate structure 202 in the first region I.

The second conductive structure 201 may be formed on the portion of the gate structure 202 in the first region I. Correspondingly, a distance between the first conductive structures 204 and the second conductive structure 201 may be reduced significantly. And an integration level of the formed semiconductor structure may be improved. However, in the method illustrated in FIG. 2, first conductive openings and a second conductive openings corresponding to the first conductive structures 204 and the second conductive structure 201 respectively may be formed by exposing a photomask mask with an extreme ultraviolet light source at one time. As the device density of the semiconductor structure becomes higher and higher, the short connection between the first conductive structures 204 and the second conductive structure 201 may be easy to occur in the subsequent processes of the first conductive structure 204 and the second conductive structure 201. The performance of the formed semiconductor structure may be poor.

The present disclosure provides a semiconductor structure and its fabrication method. In the present disclosure, a second conductive structure may be formed in a corresponding opening. The second conductive structure may contact a gate structure. Since the opening may be formed on the gate structure and in first conductive structures, a distance between the first conductive structures and the second conductive structure may be reduced significantly, and an integration level of the formed semiconductor structure may be improved. Further, an insulating layer may be formed in the opening between the first conductive structures and the second conductive structure. Electrical insulation of the insulating layer may be used to effectively prevent the short connection between the first conductive structures and the second conductive structure, to improve the electrical performance of the formed semiconductor structure.

Reference will now be made in detail to exemplary embodiments of the disclosure, which are illustrated in the accompanying drawings. Wherever possible, the same reference numbers will be used throughout the drawings to refer to the same or like parts.

The present disclosure provides a fabrication method of a semiconductor structure. FIGS. 3-11 illustrate semiconductor structures corresponding to certain stages for forming an exemplary semiconductor structure.

Figure 3:
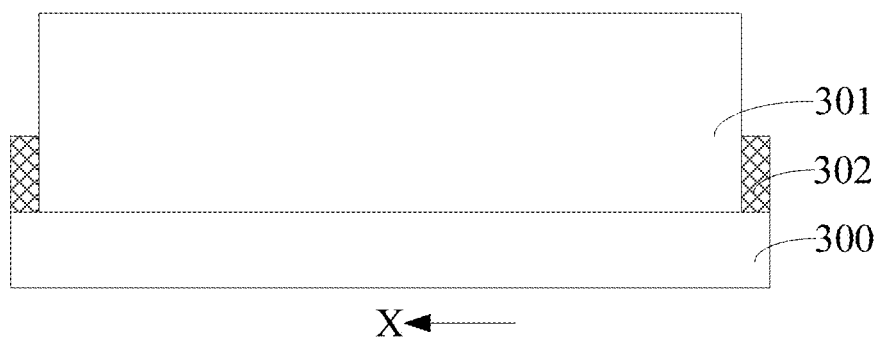
FIGS. 3-11 illustrate semiconductor structures corresponding to certain stages for forming an exemplary semiconductor structure according to various disclosed embodiments of the present disclosure.
Figure 12:
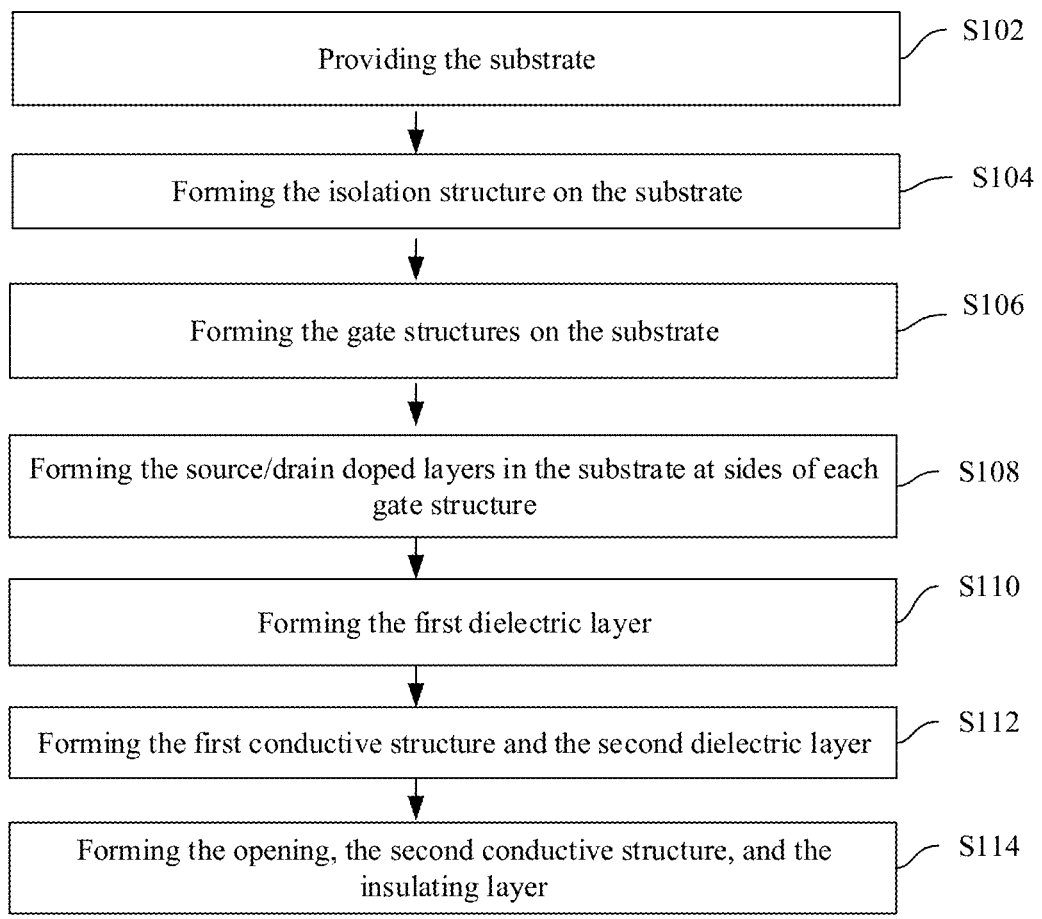
FIG. 12 illustrates an exemplary method for forming a semiconductor device according to various disclosed embodiments of the present disclosure.

As illustrated in FIG. 3, a substrate may be provided (e.g., S102 in FIG. 12).

In one embodiment, the substrate may include a base substrate 300 and a plurality of fins 301 on the base substrate 300. The plurality of fins 301 may be discrete from each other and extend along a second direction X.

The base substrate 300 and the plurality of fins 301 may be formed by: forming a first patterned layer (not shown in the figures) on the substrate; and etching the substrate by using the first patterned layer as a mask, to form the base substrate 300 and the plurality of fins 301.

In one embodiment, the base substrate 300 may be made of single-crystal silicon. In other embodiments, the base substrate 300 may be made of polycrystalline silicon, amorphous silicon, a semiconductor material including germanium, SiGe, or GaAs, or a combination thereof.

In one embodiment, the plurality of fins 301 may be made of single-crystal silicon. In other embodiments, the plurality of fins 301 may be made of single-crystal SiGe or another semiconductor material.

In some other embodiments, the substrate may be a structure without fins.

As illustrated in FIG. 3, an isolation structure 302 may be formed on the substrate (e.g., S104 in FIG. 12).

In one embodiment, the isolation structure 302 may cover a portion of sidewalls of the plurality of fins 301. A top surface of the isolation structure 302 may be lower than top surfaces of the plurality of fins 301.

The isolation structure 302 may be formed by: forming an initial isolation structure (not illustrated) on the substrate to cover the plurality of fins 301; planarizing the initial isolation structure to expose the top surfaces of the plurality of fins 301; and after planarizing, removing a portion of the initial isolation structure to form the isolation structure 302, such that the top surface of the isolation structure 302 may be lower than the top surfaces of the plurality of fins 301.

In one embodiment, the initial isolation structure may be planarized by using a wet etch process. In some other embodiments, the initial isolation structure may be planarized by using a dry etch process or a chemical mechanical polishing process.

In one embodiment, the isolation structure 302 may be made of $SiO_2$. In other embodiments, the isolation structure 302 may be made of a material including $SiN_x$ or SiNO.

Figure 4:
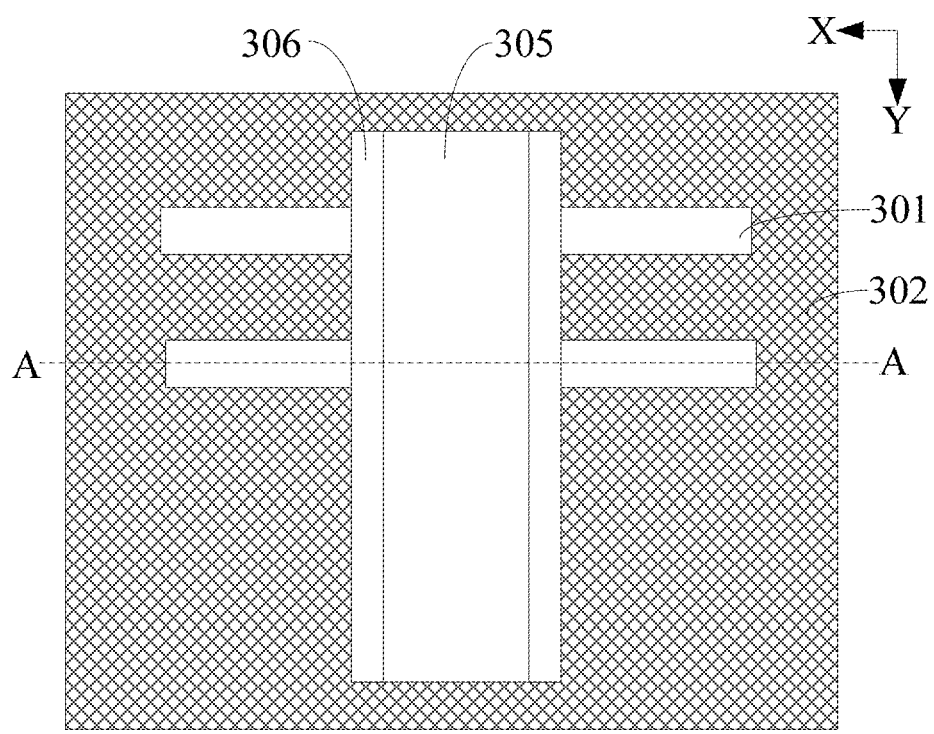
Figure 5:
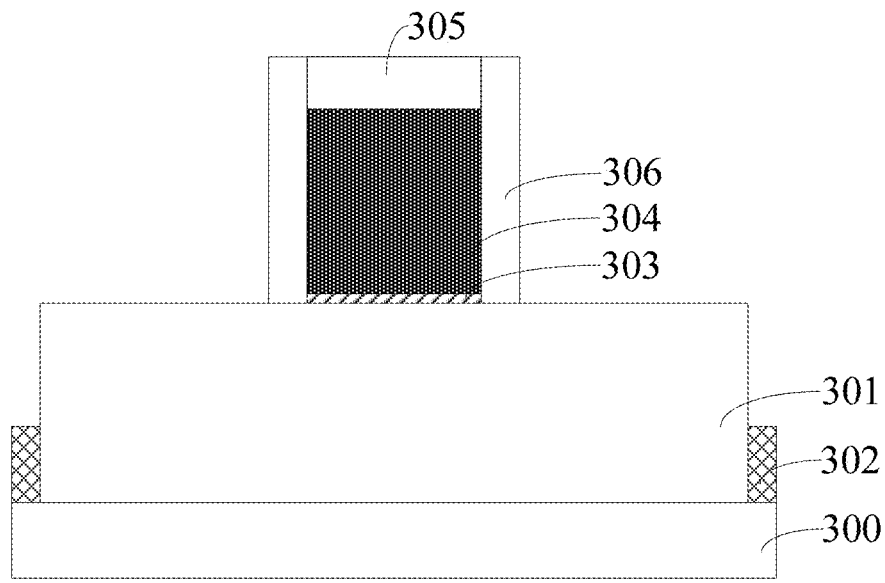

As illustrated in FIG. 4 and FIG. 5 which is a cross-sectional view along an A-A direction in FIG. 4, gate structures may be formed on the substrate (e.g., S106 in FIG. 12). The gate structures may extend along a first direction Y.

In one embodiment, multiple gate structures may be formed on the isolation structure 302. The gate structures may cross the plurality of fins 301, and cover a portion of sidewalls and top surfaces of the plurality of fins 301.

In one embodiment, each gate structure may include a gate dielectric layer 303, a gate electrode layer 304 on the gate dielectric layer 303, a protective layer 305 on the gate electrode layer 304, and sidewall spacers 306 at sides of the gate electrode layer 304 and the protective layer 305.

In one embodiment, the gate dielectric layer 303 may be made of a high-K dielectric material.

The gate electrode layer 304 may be made of a metal including tungsten, aluminum, copper, titanium, silver, gold, lead, nickel, or a combination thereof. In one embodiment, the gate electrode layer 304 may be made of tungsten.

The sidewall spacers 306 may be made of a material including $SiN_x$, $SiO_2$, SiNO, or a combination thereof. In one embodiment, the sidewall spacers 306 may be made of $SiN_x$.

In one embodiment, the protective layer 305 may be made of a material including $SiN_x$.

Figure 6:
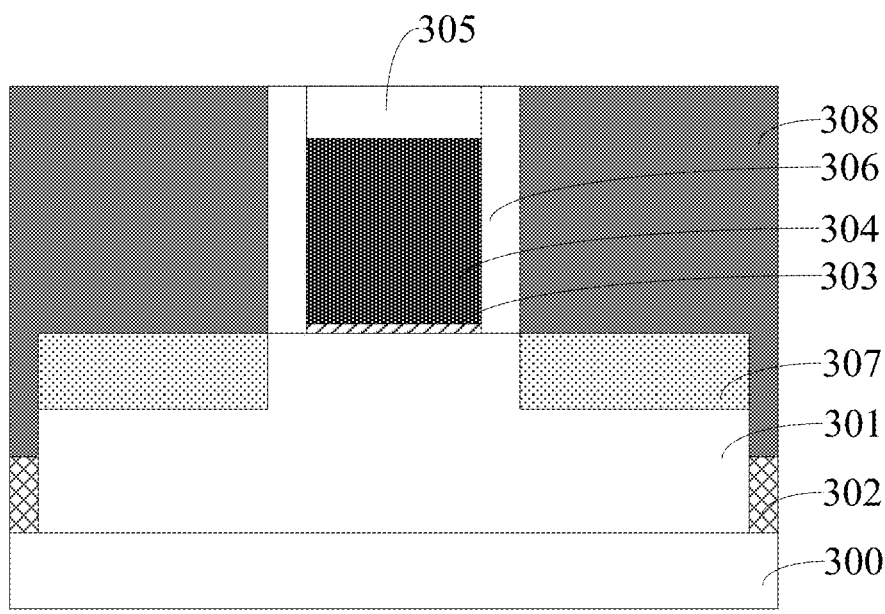

As illustrated in FIG. 6 which has a view direction same as FIG. 5, source/drain doped layers 307 may be formed in the substrate at sides of each gate structure (e.g., S108 in FIG. 12).

In one embodiment, the source/drain doped layers 307 may be formed in the plurality of fins 301.

In one embodiment, as illustrated in FIG. 6, a first dielectric layer 308 may be formed on the substrate subsequently (e.g., S110 in FIG. 12). The first dielectric layer 308 may cover the gate structures and the source/drain doped layers 307, while expose top surfaces of the gate structures.

In one embodiment, the first dielectric layer 308 may be formed on the isolation structure 302.

In one embodiment, the first dielectric layer 308, the gate structures, and the source/drain doped layers 307 may be formed by: forming gate dielectric layers 303 on the isolation structure 302; forming a dummy gate electrode layer (not shown in the figures) on each gate dielectric layer 303; form sidewall spacers 306 on sidewall surfaces of each dummy gate electrode layer; etching the plurality of fins 301 by using dummy gate electrode layers and the sidewall spacers 306 as a mask, to form source/drain openings (not shown in the figures) in the plurality of fins 301; form the source/drain doped layers 307 in the source/drain openings; forming an initial dielectric layer (not shown in the figures) on the isolation structure, to cover the dummy gate electrode layers, the sidewall spacers 306, and the source/drain doped layers 307; planarizing the initial dielectric layer until exposing the dummy gate electrode layers, to form the first dielectric layer 307; after forming the first dielectric layer 308, removing the dummy gate electrode layers to form dummy gate openings; forming a gate electrode layer 304 on a bottom surface of each dummy gate opening; forming a gate opening on each gate electrode layer 304 by removing a portion of the gate electrode layer 304; and forming a protective layer 305 in each gate opening.

In one embodiment, the first dielectric layer 308 may be made of $SiO_2$. In some other embodiments, the first dielectric layer 308 may be made of a low-k dielectric material (the low-k dielectric material may be a material with a dielectric constant smaller than 3.9) or an ultra-low-k dielectric material (the ultra-low-k dielectric material may be a material with a dielectric constant smaller than 2.5).

Figure 7:
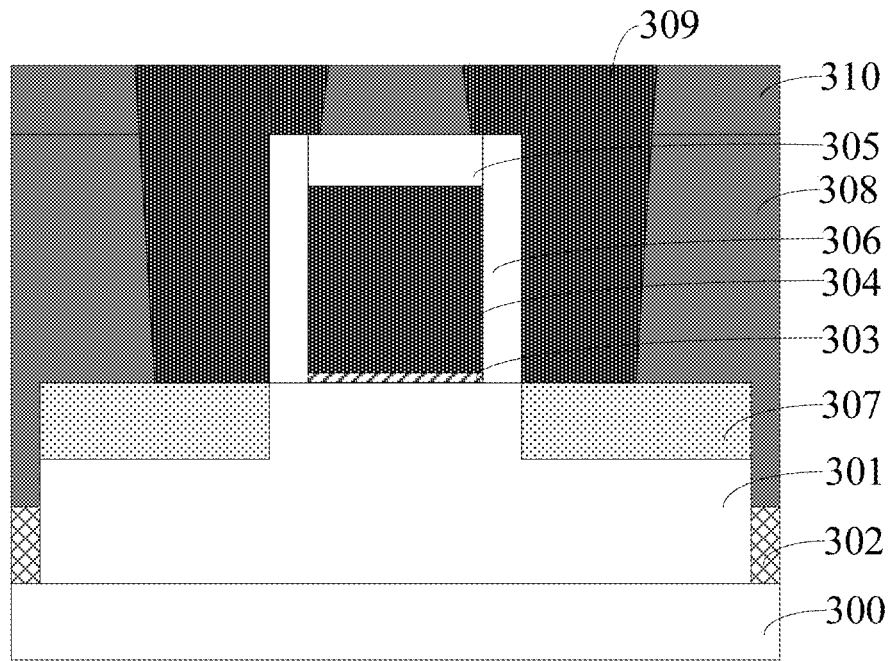

As illustrated in FIG. 7, first conductive structures 309 may be formed on the source/drain doped layers 307 (e.g., S112 in FIG. 12).

In one embodiment, the first conductive structures 309 may be formed by: forming a second dielectric layer 310 on the first dielectric layer 308 and the gate structures; forming a second patterned layer (not shown in the figures) on a top surface of the second dielectric layer 310 where the second patterned layer may expose a portion of the top surface of the second dielectric layer 310; etching the second dielectric layer 310 and the first dielectric layer 308 by using the second patterned layer as a mask until exposing top surfaces of the source/drain doped layers 307, to form first conductive openings in the first dielectric layer 308 and the second dielectric layer 310; forming first conductive structures 309 in the first conductive openings; and removing the second patterned layer after forming the first conductive structures 309.

In the present disclosure, the first conductive structures 309 may be formed on a portion of the top surfaces of the protective layers 305, and may contact the sidewall spacers 306. The first conductive structures 309 may be self-aligned structures. Subsequently, when forming the first conductive openings corresponding to the first conductive structures 309, the protective layers 305 and the sidewall spacers 306 may be made of materials different from the material of the first dielectric layer 308, and requirements on the accuracy of openings of a photomask mask may be reduced. The process difficulties may be reduced then.

In one embodiment, the first conductive structures 309 may be made of a metal including tungsten.

In one embodiment, the second dielectric layer 310 may be made of $SiO_2$. In some other embodiments, the second dielectric layer 309 may be made of a low-k dielectric material (the low-k dielectric material may be a material with a dielectric constant smaller than 3.9) or an ultra-low-k dielectric material (the ultra-low-k dielectric material may be a material with a dielectric constant smaller than 2.5).

In one embodiment, the first conductive structures 309 may be disposed between two adjacent gate structures, and extend along the first direction Y.

In one embodiment, a depth-to-width ratio of the first conductive structures 309 may be about 1:1 to about 2:1.

After forming the first conductive structures 309, the method may further include: forming an opening in the first conductive structures 309 and on the gate structures where the opening extends along the second direction X different from the first direction Y; forming a second conductive structure in the opening; and forming an insulating layer in the opening. The second conductive structure may contact the gate structures, and the insulating layer may be disposed between the first conductive structures 309 and the second conductive structure. The opening, the second conductive structure, and the insulating layer may be formed as illustrated in FIGS. 8-11 (e.g., S114 in FIG. 12).

Figure 8:
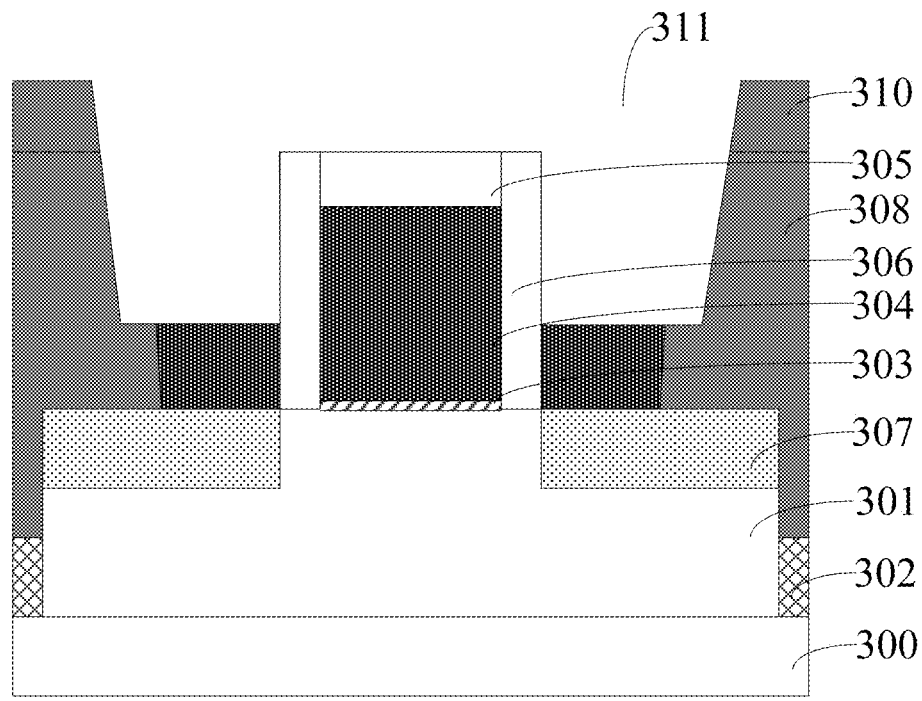

As illustrated in FIG. 8, a third patterned layer (not shown in the figures) may be formed on the second dielectric layer 310 and the first conductive structures 309. The third patterned layer may expose a portion of the first conductive structures 309 and the second dielectric layer 310. Subsequently, the first conductive structures 309 and the second dielectric layer 310 may be etched by using the third patterned layer as a mask, until exposing the top surfaces of the gate structures, to form the opening 311. The opening 311 may extend along the second direction X. After forming the opening 311, the third patterned layer may be removed.

In one embodiment, the first direction Y may be perpendicular to the second direction X.

In one embodiment, the opening 311 may penetrate through the first conductive structures 309 at sides of the opening 311 along the second direction X.

By making the opening 311 penetrate through the first conductive structures 309, a volume of the opening 311 may be effectively increased. In subsequent processes, a volume of the corresponding second conductive structure formed in the opening 311 may also be effectively increased and a contact resistance between the second conductive structure and other device structures may be suppressed. Correspondingly, the electrical performance of the formed semiconductor structure may be improved.

Figure 9:
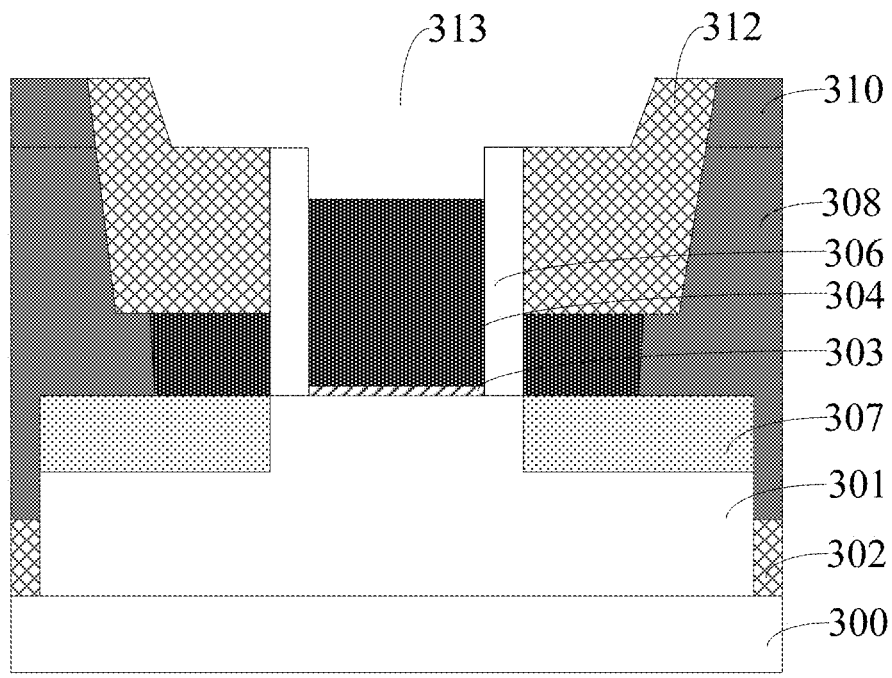

As illustrated in FIG. 9, an initial insulating layer (not shown in the figures) may be formed in the opening 311. Then a patterned layer (not shown in the figures) may be formed on the initial insulating layer to expose a portion of a top surface of the initial insulating layer. The initial insulating layer may be etched by using the patterned layer as a mask, to form the insulating layer 312 and an insulating opening 313 in the insulating layer 312. The insulating opening 313 may expose the gate structures.

In one embodiment, the insulating opening 313 may expose the gate electrode layers 304 of the gate structures.

In one embodiment, the insulating layer 312 may be made of $SiO_2$. In some other embodiment, the insulating layer 312 may be made of a material including SiCO.

Figure 10:
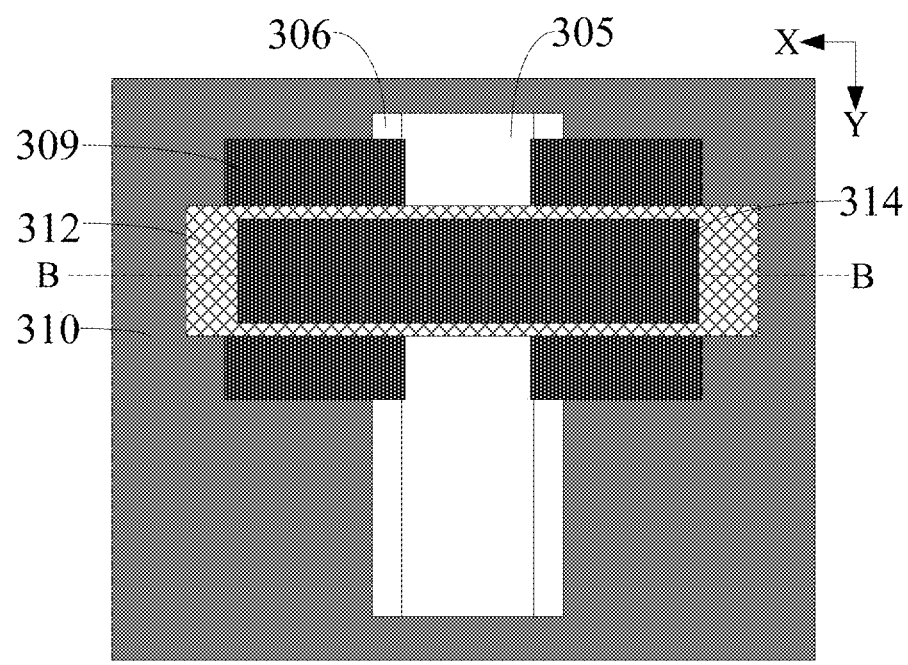
Figure 11:
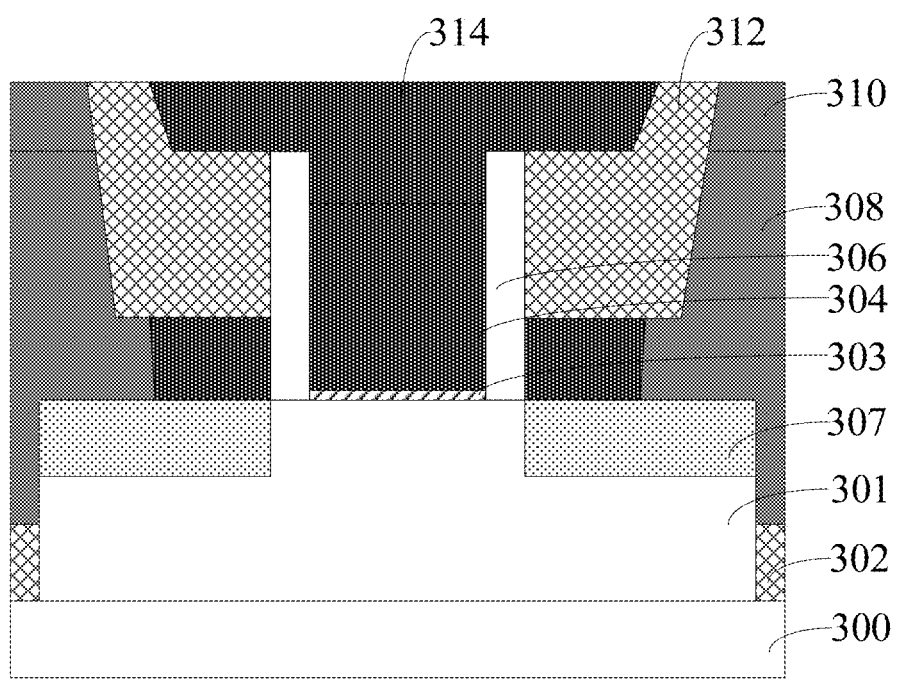

As illustrated in FIG. 10 and FIG. 11 which is a cross-sectional view along a B-B direction in FIG. 10, after forming the insulating layer 312 and the insulating opening 313, a second conductive structure 314 may be formed in the insulating opening 313. The second conductive structure 314 may contact the gate structures, and the insulating layer 312 may be disposed between the first conductive structures 309 and the second conductive structure 314.

By forming the second conductive structure 314 in the opening 311, the second conductive structure 314 may contact the gate structures. Since the opening 311 may be disposed in the first conductive structures 309 and the gate structures, a distance between the first conductive structures 309 and the second conductive structure 314 may be effectively reduced, to improve the device integration level of the formed semiconductor structure.

Further, by forming the insulating layer 312 in the opening 311, the insulating layer 312 may be disposed between the first conductive structures 309 and the second conductive structure 314. Electrical isolation of the insulating layer 312 may be used to effectively prevent a short connection between the first conductive structures 309 and the second conductive structure 314, improving the electrical performance of the semiconductor structure.

In one embodiment, the second conductive structure 309 may be formed by: forming an initial conductive structure (not shown in the figures) in the insulating opening 313, on the second dielectric layer 310, and on the first conductive structures 309; and planarizing the initial conductive structure until exposing the top surfaces of the second dielectric layer 310 and the first conductive structures 309, to form the second conductive structure 314.

In one embodiment, the initial conductive structure may be planarized by a chemical mechanical polishing process.

In one embodiment, the second conductive structure 314 may be made of a metal including tungsten.

In one embodiment, a depth-to-width ratio of the second conductive structure 314 may be about 0.5:1 to about 2:1.

The present disclosure also provides a semiconductor structure. As illustrated in FIG. 10 and FIG. 11, the semiconductor structure may include: a substrate; gate structures on the substrate; source/drain doped layers 307 in the substrate at sides of each gate structure; first conductive structures 309 on the source/drain doped layers 307; an opening 311 in the first conductive structures 309 and at tops of the gate structures; a second conductive structure 314 in the opening 311; and an insulating layer 312 in the opening 311. The gate structures may extend along a first direction Y, and the opening 311 may extend along a second direction X. The first direction Y may be different from the second direction X. The second conductive structure 314 may contact the gate structures, and the insulating layer 312 may be disposed between the first conductive structures 309 and the second conductive structure 314.

By forming the second conductive structure 314 in the opening 311, the second conductive structure 314 may contact the gate structures. Since the opening 311 may be disposed in the first conductive structures 309 and the gate structures, a distance between the first conductive structures 309 and the second conductive structure 314 may be effectively reduced, to improve the device integration level of the formed semiconductor structure.

Further, by forming the insulating layer 312 in the opening 311, the insulating layer 312 may be disposed between the first conductive structures 309 and the second conductive structure 314. Electrical isolation of the insulating layer 312 may be used to effectively prevent a short connection between the first conductive structures 309 and the second conductive structure 314, improving the electrical performance of the semiconductor structure.

In one embodiment, the opening 311 may penetrate through the first conductive structures 309 at sides of the opening 311 along the second direction X. In some other embodiments, the opening 311 may not penetrate through the first conductive structures 309 at sides of the opening 311 along the second direction X.

By making the opening 311 penetrate through the first conductive structures 309, a volume of the opening 311 may be effectively increased. In subsequent processes, a volume of the corresponding second conductive structure formed in the opening 311 may also be effectively increased and a contact resistance between the second conductive structure and other device structures may be suppressed. Correspondingly, the electrical performance of the formed semiconductor structure may be improved.

In one embodiment, the semiconductor structure may include multiple gate structures. The first conductive structures 309 may be disposed between two adjacent gate structures, and may extend along the first direction Y.

In one embodiment, each gate structure may include a gate dielectric layer 303, a gate electrode layer 304 on the gate dielectric layer 303, a protective layer 305 on the gate electrode layer 304, and sidewall spacers 306 at sides of the gate electrode layer 304 and the protective layer 305. The first conductive structures 309 may be disposed on a portion of top surfaces of the protective layers 305, and may contact the sidewall spacers 306.

In one embodiment, a depth-to-width ratio of the first conductive structures 309 may be about 1:1 to about 2:1.

In one embodiment, a depth-to-width ratio of the second conductive structure 314 may be about 0.5:1 to about 2:1.

In one embodiment, the substrate may include a base substrate 300 and a plurality of fins 301 on the base substrate 300. The plurality of fins 310 may be discrete from each other and extend along the second direction X. The gate structures may cross the plurality of fins 301, and cover a portion of sidewalls and top surfaces of the plurality of fins 301. The source/drain doped layers 307 may be disposed in the plurality of fins 301 at sides of each gate structure.

In one embodiment, the semiconductor structure may further include an isolation structure 302 on the substrate. The isolation structure 302 may cover a portion of the sidewalls of the plurality of fins 301.

In one embodiment, the semiconductor structure may further include a first dielectric layer 308 covering the gate structures and the source/drain doped layers 307, and a second dielectric layer 310 on the first dielectric layer. The first dielectric layer 308 may expose the top surfaces of the gate structures. The first conductive structures 309 may be disposed in the first dielectric layer 308 and the second dielectric layer 310. The opening 311 may be further disposed in the first dielectric layer 308 and the second dielectric layer 310. The second dielectric layer 310 may expose the top surfaces of the first conductive structures 309 and the second conductive structure 314.

In one embodiment, the first conductive structures 309 may be made of a metal including tungsten.

In one embodiment, the second conductive structures 314 may be made of a metal including tungsten.

Another embodiment of the present disclosure also provides another fabrication method of a semiconductor structure. FIGS. 13-16 illustrate semiconductor structures corresponding to certain stages of the fabrication method for a semiconductor structure according to the present embodiment. The present embodiment will be illustrated based on the previous embodiments. The difference of the present embodiment compared to previous embodiments include: after forming the first conductive structures 309 (as illustrated in FIG. 7), the opening may be formed in the first conductive structures 309 and on the gate structures. In the present embodiment, the opening may not penetrate the first conductive structures on the sides along the second direction.

As illustrated in FIG. 12, a third patterned layer (not shown in the figures) may be formed on the second dielectric layer 310 and the first conductive structures 309. The third patterned layer may expose a portion of the first conductive structures 309 and the second dielectric layer 310. Subsequently, the first conductive structures 309 and the second dielectric layer 310 may be etched by using the third patterned layer as a mask, until exposing the top surfaces of the gate structures, to form the opening 311. The opening 311 may extend along the second direction X. After forming the opening 311, the third patterned layer may be removed.

In one embodiment, the first direction Y may be perpendicular to the second direction X.

In one embodiment, the opening 311 may not penetrate through the first conductive structures 309 at sides along the second direction X.

Figure 13:
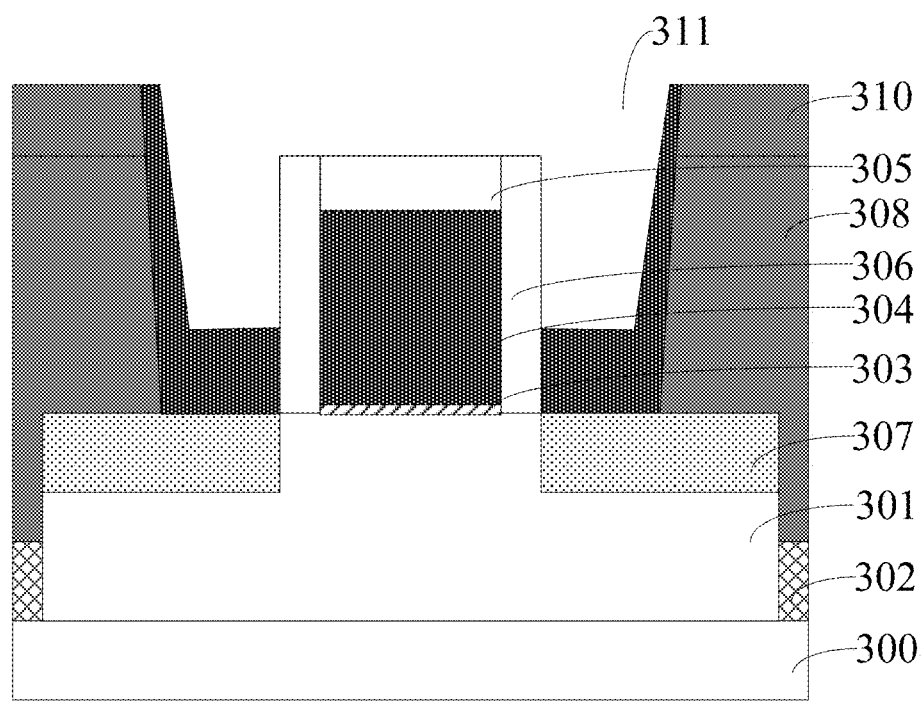
FIGS. 13-16 illustrate semiconductor structures corresponding to certain stages of forming an exemplary semiconductor structure according to various disclosed embodiments of the present disclosure.

As illustrated in FIG. 13, an initial insulating layer (not shown in the figures) may be formed in the opening 311. Then a patterned layer (not shown in the figures) may be formed on the initial insulating layer to expose a portion of a top surface of the initial insulating layer. The initial insulating layer may be etched by using the patterned layer as a mask, to form the insulating layer 312 and an insulating opening 313 in the insulating layer 312. The insulating opening 313 may expose the gate structures.

In one embodiment, the insulating opening 313 may expose the gate electrode layers 304 of the gate structures.

Figure 14:
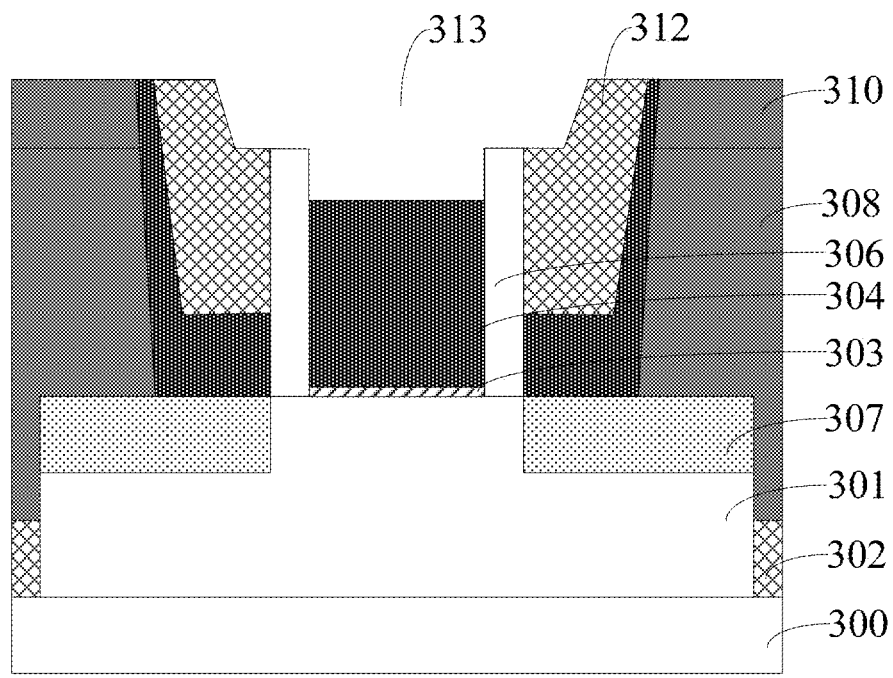
Figure 15:
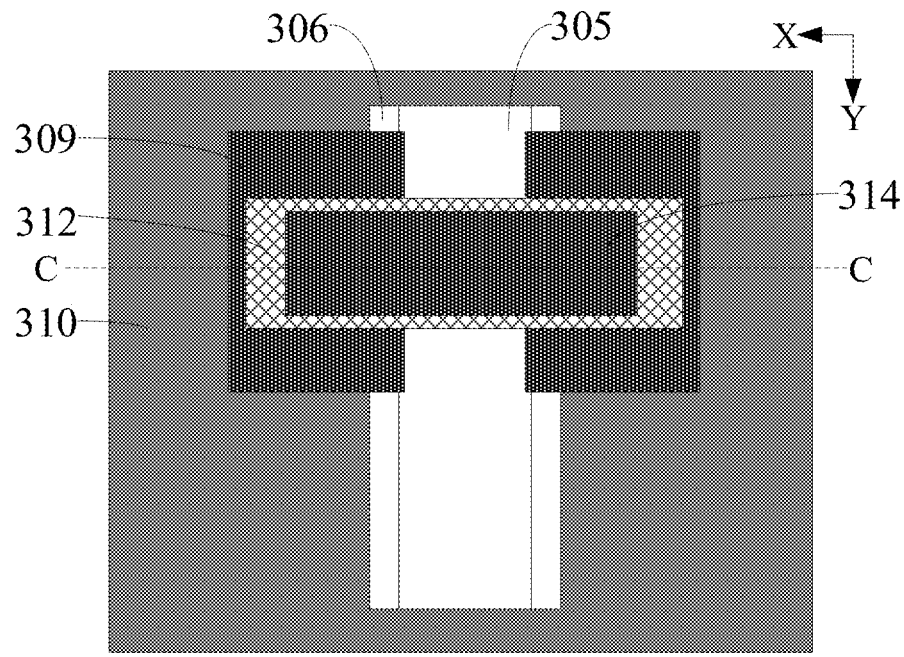
Figure 16:
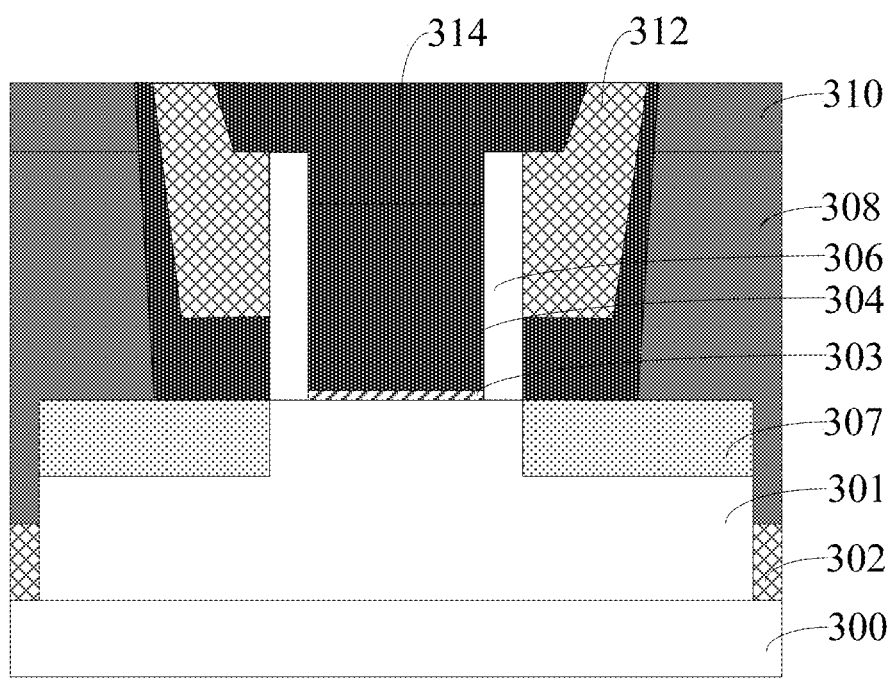

As illustrated in FIG. 14 and FIG. 15 which is a cross-sectional view along a C-C direction in FIG. 14, after forming the insulating layer 312 and the insulating opening 313, a second conductive structure 314 may be formed in the insulating opening 313. The second conductive structure 314 may contact the gate structures, and the insulating layer 312 may be disposed between the first conductive structures 309 and the second conductive structure 314.

In the present disclosure, the second conductive structure may be disposed in the opening and contact the gate structures. Since the opening may be disposed in the first conductive structure and on the gate structures, the distance between the first conductive structure and the second conductive structure may be reduced effectively, to improve the device integration level of the formed semiconductor structure.

Further, the insulating layer may be disposed in the opening. The insulating layer may be disposed between the first conductive structure and the second conductive structure. Electrical insulation of the insulating layer may be used to prevent short connection between the first conductive structure and the second conductive structure, to improve the electric performance of the formed semiconductor structure.

Further, the opening may penetrate through the first conductive structure at sides along the second direction. By making the opening penetrate through the first conductive structure, the volume of the opening may be increased effectively. In the subsequent processes, the volume of the second conductive structure formed in the opening may be increased too. The contact resistance between the second conductive structure and other devices or structures may be reduced, to improve the electric performance of the formed semiconductor structure.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
   a substrate;
   a gate structure on the substrate, wherein the gate structure extends along a first direction, the gate structure includes a gate dielectric layer, a gate electrode layer on the gate dielectric layer, a protective layer on the gate electrode layer, and sidewall spacers at sides of the gate electrode layer and the protective layer, and the protective layer and the sidewall spacers are made of a first material;
   source/drain doped layers in the substrate at sides of the gate structure;
   a first conductive structure on the source/drain doped layers, wherein an opening is formed on the gate structure and the first conductive structure, wherein the opening extends along a second direction different from the first direction;
   a second conductive structure in the opening, wherein the second conductive structure is insulated from the first conductive structure and in contact with the gate structures; and
   an insulating layer in the opening, wherein the insulating layer is disposed between the first conductive structure and the second conductive structure, and the insulating layer is made of a second material different from the first material.

2. The semiconductor structure according to claim 1, wherein:
   the opening passes across the first conductive structure at the sides of the gate structure along the second direction.

3. The semiconductor structure according to claim 1, wherein:
   the opening does not pass across the first conductive structure at the sides of the gate structure along the second direction.

4. The semiconductor structure according to claim 1, further including:
   multiple gate structures, wherein
   the first conductive structure is disposed between adjacent gate structures and extends along the first direction.

5. The semiconductor structure according to claim 1, wherein:
   the second conductive structure is disposed at a top surface of the protective layer, and is in contact with the sidewall spacers.

6. The semiconductor structure according to claim 1, wherein a depth-to-width ratio of the first conductive structure is about 1:1 to about 2:1.

7. The semiconductor structure according to claim 1, wherein a depth-to-width ratio of the second conductive structure is about 0.5:1 to about 2:1.

8. The semiconductor structure according to claim 1, wherein:
   the substrate includes a base substrate and a plurality of fins discrete on the base substrate;
   the plurality of fins extends along the second direction;
   the gate structure crosses the plurality of fins and covers a portion of sidewalls and top surfaces of the plurality of fins; and
   the source/drain doped layers are disposed in a corresponding fin at sides of the gate structure.

9. The semiconductor structure according to claim 8, further including an isolation structure on the substrate, wherein:
   the isolation structure covers a portion of the sidewalls of the plurality of fins.

10. The semiconductor structure according to claim 1, further including a first dielectric layer and a second dielectric layer on the first dielectric layer, wherein:
    the first dielectric layer covers the source/drain doped layers;
    the first dielectric layer exposes top surfaces of the gate structure;
    the opening is further disposed in the first dielectric layer and the second dielectric layer; and
    the second dielectric layer exposes top surfaces of the first conductive structure and the second conductive structure.

11. The semiconductor structure according to claim 1, wherein:
    the first conductive structure is made of a metal including tungsten.

12. The semiconductor structure according to claim 1, wherein:
    the second conductive structure is made of a metal including tungsten.

13. A method for forming a semiconductor structure, comprising:
    providing a substrate;
    forming a gate structure on the substrate, wherein the gate structure extends along a first direction, the gate structure includes a gate dielectric layer, a gate electrode layer on the gate dielectric layer, a protective layer on the gate electrode layer, and sidewall spacers at sides of the gate electrode layer and the protective layer, and the protective layer and the sidewall spacers are made of a first material;
    forming source/drain doped layers in the substrate at sides of the gate structure;
    forming a first conductive structure on the source/drain doped layers;
    forming an opening on the gate structure and the first conductive structure, wherein the opening extends along a second direction which is different from the first direction;

forming an insulating layer in the opening and an insulating opening in the insulating layer, wherein the insulating opening exposes the gate structure, and the insulating layer is made of a second material different from the first material; and forming a second conductive structure in the insulating opening, wherein the second conductive structure is insulated from the first conductive structure and is in contact with the gate structure.

14. The method according to claim 13, wherein:
the opening passes across the first conductive structure at the sides of the gate structure along the second direction.

15. The method according to claim 14, wherein:
the opening does not pass across the first conductive structure at the sides of the gate structure along the second direction.

16. The method according to claim 14, wherein:
the insulating layer is formed by:
   forming an initial insulating layer in the opening;
   forming a patterned layer on the initial insulating layer to expose a portion of a top surface of the initial insulating layer; and
   etching the initial insulating layer by using the patterned layer as a mask, to form the insulating layer and the insulating opening in the insulating layer.

17. The method according to claim 13, further including:
forming multiple gate structures, wherein:
the first conductive structure is disposed between adjacent gate structures and extends along the first direction.

18. The method according to claim 13, wherein:
the second conductive structure is disposed on a top surface of the protective layer, and is in contact with the sidewall spacers.

19. The method according to claim 13, wherein:
the substrate includes a base substrate and a plurality of fins discrete on the base substrate;
the plurality of fins extends along the second direction;
the gate structure crosses the plurality of fins and covers a portion of sidewalls and top surfaces of the plurality of fins; and
the source/drain doped layers are disposed in a corresponding fin at sides of the gate structure.

\* \* \* \* \*